United States Patent [19]

Choi

[11] Patent Number: 5,748,531

[45] Date of Patent: May 5, 1998

[54] COMMON SOURCE LINE CONTROL CIRCUIT FOR PREVENTING SNAP BACK BREAKDOWN

[75] Inventor: Byeng-Sun Choi, Kyungki-do, Rep. of Korea

[73] Assignee: Samsung Electronics Co., Ltd., Suwon, Rep. of Korea

[21] Appl. No.: 672,663

[22] Filed: Jun. 28, 1996

[30] Foreign Application Priority Data

Jun. 30, 1995 [KR] Rep. of Korea ............... 18962/1995
Dec. 7, 1995 [KR] Rep. of Korea ............... 47558/1995

[51] Int. Cl.$^6$ .................... G11C 11/34; G11C 7/00
[52] U.S. Cl. ............... 365/185.18; 365/185.25; 365/185.29; 365/218
[58] Field of Search ............ 365/185.18, 185.25, 365/185.26, 185.29, 185.3, 185.33, 218

[56] References Cited

U.S. PATENT DOCUMENTS

| | | | |
|---|---|---|---|
| 4,247,918 | 1/1981 | Iwahashi et al. | 365/185.12 |
| 4,653,026 | 3/1987 | Komori et al. | 365/185.25 |
| 5,010,520 | 4/1991 | Minagawa et al. | 365/185.25 |
| 5,077,691 | 12/1991 | Haddad et al. | 365/218 |
| 5,109,361 | 4/1992 | Yim et al. | 365/185.12 |
| 5,126,808 | 6/1992 | Montalvo et al. | 365/185.12 |
| 5,182,725 | 1/1993 | Andoh et al. | 365/185.12 |
| 5,185,718 | 2/1993 | Rinerson et al. | 365/185.12 |
| 5,220,528 | 6/1993 | Mielke | 365/185.12 |
| 5,477,499 | 12/1995 | Van Buskirk et al. | 365/218 |
| 5,491,657 | 2/1996 | Haddad et al. | 365/185.26 |
| 5,546,340 | 8/1996 | Hu et al. | 365/218 |
| 5,546,341 | 8/1996 | Suh et al. | 365/218 |

*Primary Examiner*—David C. Nelms
*Assistant Examiner*—Trong Phan
*Attorney, Agent, or Firm*—Marger, Johnson, McCollom & Stolowitz, P.C.

[57] ABSTRACT

A common source line control circuit for a semiconductor memory device includes a resistor connected in series with a transistor to reduce the voltage across the transistor, thereby preventing snap back breakdown. The resistor and transistor are connected in series with a second transistor which together form a current path between the bulk region of a memory cell array and a ground node for discharging the bulk region during an erase voltage recovery period. The resistor can be connected between the transistors or between one transistor and the bulk region. A second resistor can be connected in series with the other resistor and the two transistors. The resistance values of the resistors are larger than the channel resistances of the transistors.

20 Claims, 6 Drawing Sheets

5,748,531

1

COMMON SOURCE LINE CONTROL CIRCUIT FOR PREVENTING SNAP BACK BREAKDOWN

BACKGROUND OF THE INVENTION

1. Field of the Invention

This invention relates generally to semiconductor memory devices and more specifically to common source line control circuits for semiconductor memory devices.

This application corresponds to Korean Patent application No. 18962/1995 filed Jun. 30, 1995 and Korean Patent application No. 47558/1995 filed Dec. 7, 1995 both in the name of Samsung Electronics Co., Ltd., and which are hereby incorporated by reference.

2. Description of the Related Art

An electrically erasable and programmable nonvolatile semiconductor memory having a NAND type memory cell array typically includes a string selection transistor, a plurality of memory cells and a ground selection transistor connected in series with one another. An erase operation is performed by repeating a unit erase operation and a unit erase verification operation. There is an erase voltage recovery period between the unit erase operation and the unit erase verification operation for discharging the bulk of the NAND type memory cell array which has been charged over 20 volts with respect to a ground voltage level . In a 32 Mb nonvolatile semiconductor memory device, the bulk capacitance during a chip erasing operation is 30 nF–40 nF. As the density of the device increases, the bulk capacitance increases accordingly.

FIG. 1A shows a prior art common source line control circuit for discharging the bulk capacitance of a memory cell array. Referring to FIG. 1A, the channels of NMOS transistor 1 and depletion type NMOS transistor 2 are connected in series between a ground voltage VSS and a bulk 3 of the memory cell array. A signal Vabd which has a voltage over 6 volts is applied to the gate of the depletion type NMOS transistor 2 during the unit erase operation to raise the junction breakdown voltage level. A signal /ERA is connected to the gate of the NMOS transistor 1. The signal /ERA is at the ground voltage level during the unit erase period and the power supply voltage VCC during the unit erase voltage recovery period and the unit erase verification period. (The symbol "/" will herein be used to indicate a low true logic signal.)

In a typical depletion type NMOS transistor, snap back breakdown occurs when the voltage difference between the drain and source (hereinafter referred to as "Vds") is over 13 volts and the current flowing through the drain and source is several mA. During the unit erase operation, an erase voltage (for example, 20 volts) is applied to the common source line CSL, and 8 volts is applied to the source of the depletion type NMOS transistor 2. Thus, Vds of the depletion type NMOS transistor 2 during the unit erase period is 12 volts. In this state, if the signal /ERA goes to the power supply voltage level VCC, the erase voltage charge in the bulk 3 is discharged through the depletion type NMOS transistor 2 and the NMOS transistor 1. The voltage of the common source line (hereinafter referred to as "Vera") and the voltage of the source of the depletion type NMOS transistor 2 (hereinafter referred to as "Vs") are determined by the resistances of the depletion type NMOS transistor 2 and the NMOS transistor 1 which will be discussed hereinbelow with reference to FIG. 1B.

FIG. 1B is an equivalent circuit diagram showing the common source line control circuit during the erase voltage

2 recovery period. Referring to FIG. 1B, the voltage at the source of NMOS transistor 2 is given by the expression:

$$Vs = Vera \times [R2/(R1+R2)] \tag{1}$$

where Vs cannot be over 8 volts. Assuming that the bulk capacitance is 30 nF, $Vera = 20e^{-(1/(R1+R2)30\times10^{-9})\times t)}$. That is, if the resistor R2 is smaller than the resistor R1, the voltage Vs falls below 8 volts due to rapid the discharge at the moment the signal /ERA switches to the power supply voltage level VCC. Thus, the voltage Vds rises over 13 volts, causing snap back breakdown between the active region of the source and drain of the depletion type NMOS transistor 2 and the substrate. Due to the large capacitance of the bulk 3, the snap back breakdown occurs for a long time, resulting in the destruction of the depletion type NMOS transistor 2.

Accordingly, a need remains for common source line control circuit which can overcome the problems discussed above.

SUMMARY OF THE INVENTION

It is, therefore, an object of the invention to provide a common source line control circuit which can prevent the destruction of a transistor due to snap back breakdown.

One aspect of the present invention is a circuit for controlling a common source line in a semiconductor memory device, the circuit comprising: a first transistor coupled between the common source line and a ground node to provide a resistive current path between the common source line and the ground node; a second transistor coupled between the first transistor and the ground node to provide a resistive current path between the first transistor and the ground node; and a resistor coupled in series with the first and second transistors between the common source line and the ground node to reduce the voltage across the first transistor, thereby preventing snap back breakdown.

The resistance of the resistor is greater than the resistances of the first and second transistors. The resistor can be coupled between the first transistor and the second transistor, or the resistor can be coupled between the second transistor and the common source line.

The circuit can include a second resistor coupled in series with the first and second transistors between the common source line and the ground node to reduce the voltage across the first transistor, thereby preventing snap back breakdown.

The common source line is coupled to a bulk region to discharge the bulk region during an erase recovery period, and the resistor and transistors are constructed so as to limit the voltage across the first transistor during the erase recovery period. The resistor and transistors are constructed so as to limit the current through the first transistor during the erase recovery period.

The circuit can include a third transistor coupled between the common source line and the ground node to provide a resistive current path between the common source line and the ground node; and a fourth transistor coupled between the third transistor and the ground node to provide a resistive current path between the third transistor and the ground node.

The memory device includes a memory cell coupled to the common source line, and the channel resistors of the third and fourth transistors are small so as to prevent a reduction in the sense margin of the memory cell due to an increase in the voltage of the common source line during a read mode.

Another aspect of the present invention is a method for controlling a common source line in a semiconductor device memory comprising: coupling a first transistor between the common source line and a ground node to provide a resistive current path between the common source line and the ground node; coupling a second transistor between the first transistor and the ground node to provide a resistive current path between the first transistor and the ground node; coupling a resistor in series with the first and second transistors between the common source line and the ground node; and applying a voltage signal to the gate of the second transistor to turn the second transistor on during an erase recovery period.

Applying a voltage signal includes gradually increasing the voltage at the gate of the second transistor, thereby reducing the voltage across the first transistor.

The method further includes applying a second voltage signal to the gate of the first transistor during an erase period before the erase recovery period, the second voltage signal having a voltage high enough to raise the junction breakdown voltage level of the first transistor.

The foregoing and other objects, features and advantages of the invention will become more readily apparent from the following detailed description of a preferred embodiment of the invention which proceeds with reference to the accompanying drawings.

DETAILED DESCRIPTION OF A PREFERRED EMBODIMENT

Construction of the NAND type memory cell is disclosed in an article "New Device Technology for 5V-only 4 Mb EEPROM with NAND structure cell" IEDM 1988, pp 412–415 and the construction and read/write operations of the electrically erasable and programmable nonvolatile semiconductor memory device are disclosed in the U.S. Pat. No. 5,473,563.

Figure 1A:
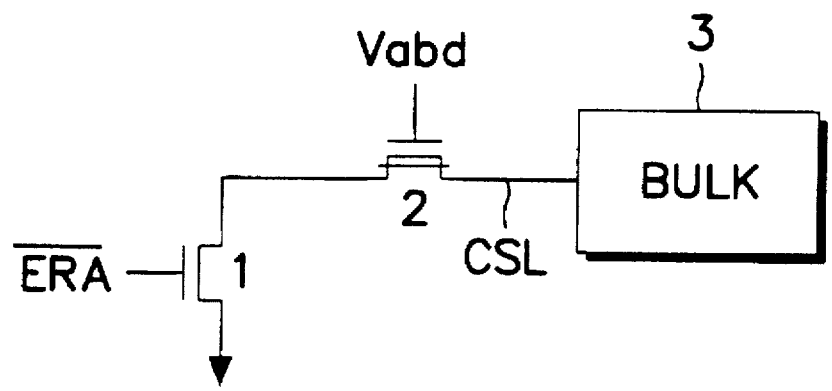
FIG. 1A is a schematic diagram of a prior art common source line control circuit.
Figure 1B:
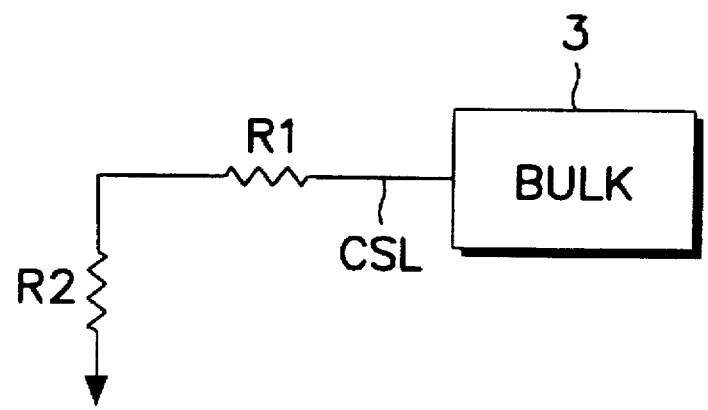
FIG. 1B is a schematic diagram of an equivalent circuit of the prior art circuit of FIG. 1A.
Figure 2:
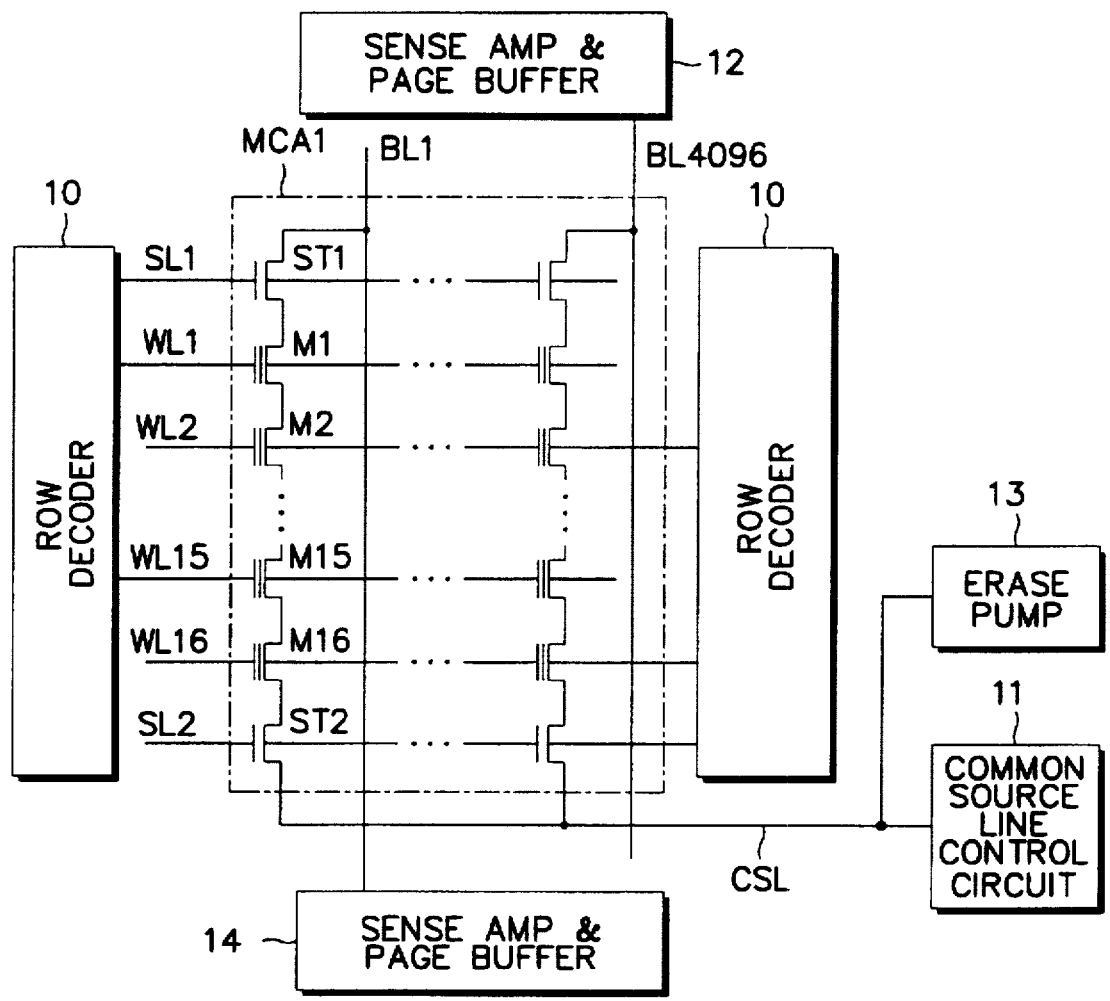
FIG. 2 is a block diagram of a semiconductor memory device in accordance with the present invention.

FIG. 2 shows the construction of one sub memory block of a memory array in a nonvolatile semiconductor memory device in accordance with the present invention. For purposes of illustration, it is assumed that the memory device is 32 Mb. A sub memory block MCA1 comprised of 4096 memory strings is 4 Kb (4096b), and a memory block (not shown) comprised of 512 sub memory blocks is 2 Mb. Therefore, 16 memory blocks constitute a nonvolatile semiconductor memory device of 32 Mb. It should be understood that the principles of the present invention apply regardless of the particular memory arrangement.

Referring to FIG. 2, two row decoders 10 for selecting string selection lines SL1, SL2 and word lines WL1 to WL16 are respectively placed on the right and left sides of the memory array. Sense amplifier and page buffer blocks 12 and 14 are respectively placed at the top and bottom of the memory array, each being allocated to one half of the memory array. The sense amplifier and page buffer blocks 12 and 14 include a plurality of page buffers for temporarily storing data that is transferred from or to the memory cells (or memory transistors), and a plurality of sense amplifiers for sensing data from or to the memory cells, each sense amplifier or page buffer being connected to a corresponding one of the bit lines BL1 to BL4096. The source of the selection transistor ST2 for supplying a ground voltage or an erase voltage to the source of the series-connected memory cells M1 to M16 is connected to a common source line control circuit 11 via the common source line CSL. While an output terminal of an erase pump 13 is shown to be connected to the common source line CSL in FIG. 2, the erase voltage from the erase pump 13 is actually coupled through a forward-biased junction to the common source line CSL.

In such a NAND type flash memory, the sources of the memory cells M1 to M16 are formed with impurities of high concentration within the bulk (impurity-implanted well or substrate). Therefore, during the erase operation, the erase voltage generated from the erase pump 13 is transferred to the common source line CSL and then is supplied to the sources of the memory cells via the bulk.

Figure 3:
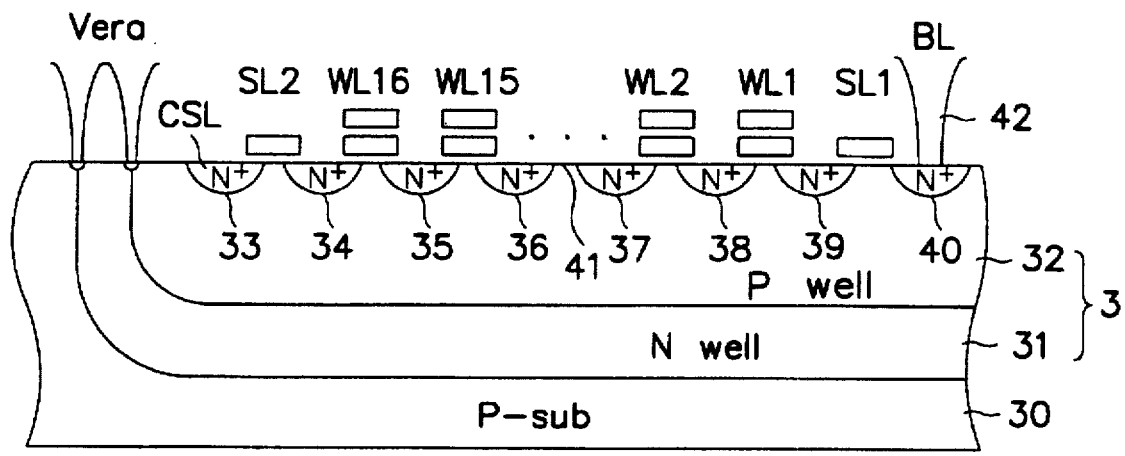
FIG. 3 is a cross sectional view of a semiconductor memory device in accordance with the present invention.

FIG. 3 is a cross sectional view showing the construction of NAND type memory cells in a semiconductor memory device in accordance with the present invention. Referring to FIG. 3, the semiconductor substrate 30 is a P-type silicon monocrystalline semiconductor substrate. A P-type well region 32 is formed having a depth of about 4 μm from the main surface of the substrate 30. The P-type well region 32 is surrounded by an N-type well region 31. In the P-type well region 32, $N^+$ regions 33 to 40 doped with N-type impurities of high concentration are each separated by a plurality of channel regions 41. The $N^+$ region 40 is a contact region connected to the bit line BL via a contact hole 42 and also serves as a drain region of the first selection transistor ST1. The $N^+$ regions 34 to 39 each serve as common source-drain regions for the first selection transistor ST1, memory transistors M1 to M16 and second selection transistor ST2. The $N^+$ region 33 serves both as a source region of the second selection transistor ST2 and as buried common source line CSL. The common source line CSL contacts the $N^+$ region 33 via a contact hole. Each floating gate (e.g., 44) is formed on an insulating layer over the channel region 41. Each control gate (e.g., 46) is formed on an insulating layer over the floating gate. The bulk 3 including the N-type well region 31 and the P-type well region 32 is connected to the voltage Vera.

The following table (1) shows the states of the control signals of the memory cell array in the erase and erase verification modes.

TABLE 1

| Signal | Erase Mode | Erase Verification Mode |
| --- | --- | --- |
| BL | Floating | Floating |
| SL1 | VCC | VCC |
| WL1 | 0 V | 0 V |
| . | . | . |
| . | . | . |
| . | . | . |
| WL16 | 0 V | 0 V |
| SL2 | VCC | VCC |
| Bulk | >20 V | 0 V |
| Source | Floating | 0 V |

Referring to the Table (1), during the erase mode, the bit lines BL1 to BL4096 connected to the drains of the memory cells are in floating states. The selection lines SL1 and SL2 connected to the gates of the first and second selection transistors ST1 and ST2 stay at the power supply voltage level VCC. The word lines WL1 to WL16 connected to the control gates of the memory cells M1 to M16 stay at 0 volts, the bulk 3 stays at a high voltage level over 20 volts and the source stays in a floating state.

During the erase verification mode, the bit lines BL1 to BL4096 connected to the drains of the memory cells M1 to M16 are in floating states. The selection lines SL1 and SL2 connected to the gates of the first and second selection transistors ST1 and ST2 stay at the power supply voltage level VCC. The word lines WL1 to WL16 connected to the control gates of the memory cells M1 to M16 stay at 0 volts, and the bulk and the source stay at 0 volts.

Figure 4A:
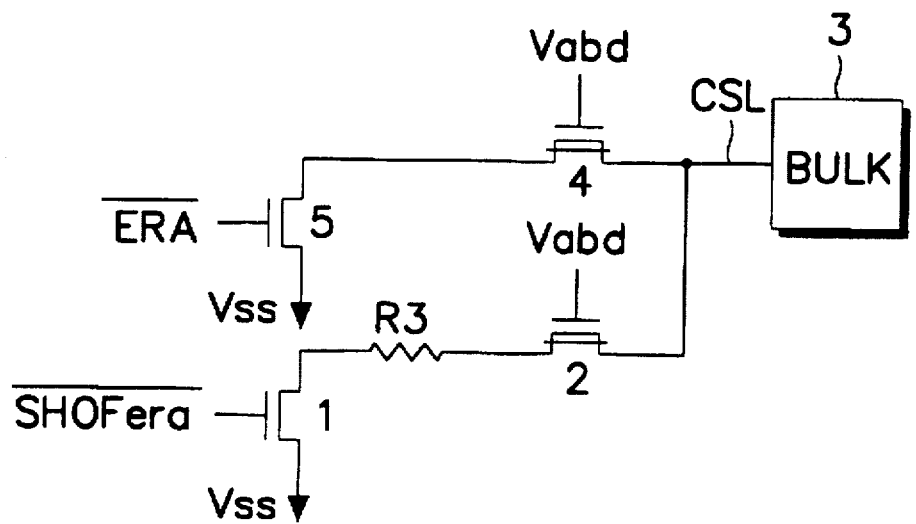
FIG. 4A is a schematic diagram of an embodiment of a common source control circuit in accordance with the present invention.

FIG. 4A is a circuit diagram showing an embodiment of a common source line control circuit according to the present invention. Referring to FIG. 4A, the common source line control circuit has first and second current paths which are connected in parallel with each other between the common source line (which is connected to the bulk 3) and a ground node having a voltage VSS. The first path has a depletion type NMOS transistor 4 and an NMOS transistor 5 the channels of which are connected in series between the common source line and the ground node VSS. The second path has a depletion type NMOS transistor 2 having one terminal of its channel connected to the common source line, an NMOS transistor 1 with one terminal of its channel connected to the ground node, and a resistor R3 having one terminal connected to the other terminal of the channel of NMOS transistor 2 and the other terminal connected to the other terminal of the channel of depletion type NMOS transistor 4. Thus, transistors 2 and 1 and resistor R3 are connected in series between the bulk 3 and the ground node VSS.

The gates of the depletion type NMOS transistors 2 and 4 are connected to the signal Vabd. The gate of the NMOS transistor 5 is connected to the signal /ERA which stays at the ground voltage level during the unit erase period and erase voltage recovery period and goes to the power supply voltage level VCC during the remaining operating periods. The gate of the NMOS transistor 1 is connected to the signal /SHOFera which stays at the ground voltage level only during the unit erase period and goes to the power supply voltage level VCC during the remaining operating periods.

The channel resistors of the depletion type NMOS transistor 4 and NMOS transistor 5 should be small so as to prevent the decrease of the memory cell sensing margin due to the increase in the voltage at the common source line by the memory cell current during the read mode, erase mode and program verification mode.

The path including the depletion type NMOS transistor 2, the resistor 3 and the NMOS transistor 1 is used for preventing snap back breakdown of the depletion type NMOS transistor 2 during the erase voltage recovery period.

Figure 4B:
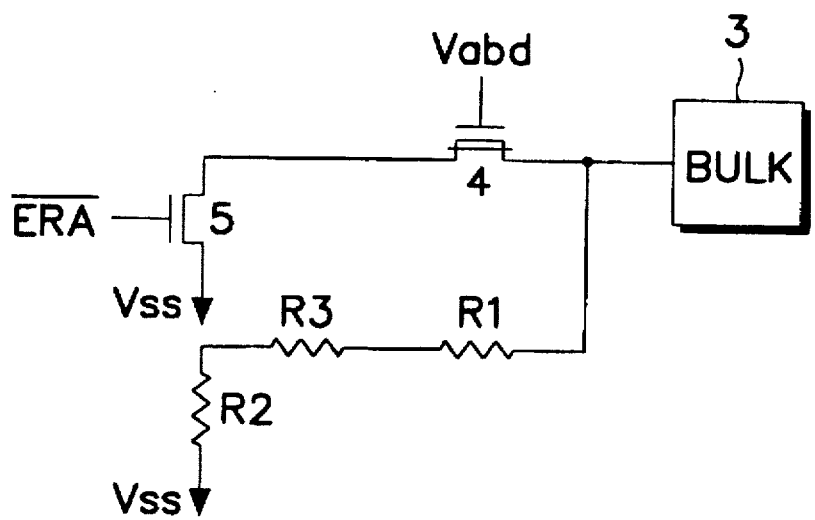
FIG. 4B is a schematic diagram of an equivalent circuit of the circuit of FIG. 4A.

FIG. 4B is an equivalent circuit diagram showing the common source line control circuit during the erase voltage recovery operation according to the present invention. Referring to FIG. 4B, a resistor R1 is an equivalent circuit of the depletion type NMOS transistor 2 and a resistor R2 is an equivalent circuit of the NMOS transistor 1.

Figure 5:
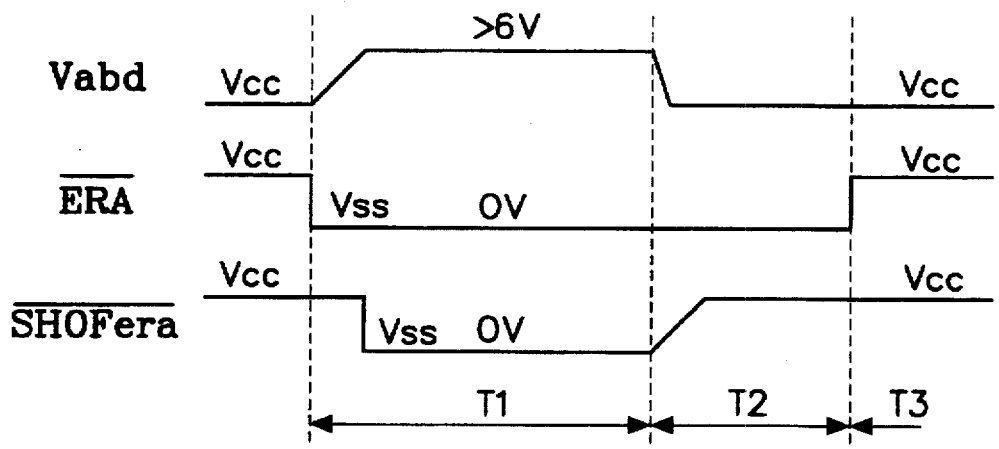
FIG. 5 is a timing diagram showing waveforms of various signal in a semiconductor memory device according to the present invention.

Referring to FIG. 5, the signal Vabd goes to over 6 volts during the unit erase period T1, while staying at the power supply voltage level VCC during the remaining operating periods. The signal /ERA stays at the ground voltage VSS level during the unit erase period T1 and the erase voltage recovery period T2, while maintaining the power supply voltage level VCC during the remaining operating periods. The signal /SHOFera stays at the ground voltage VSS level only during the unit erase period T1, and gradually transitions to the power supply voltage level VCC during the erase voltage recovery period T2, while maintaining the power supply voltage level VCC during the remaining operating periods.

Figure 6A:
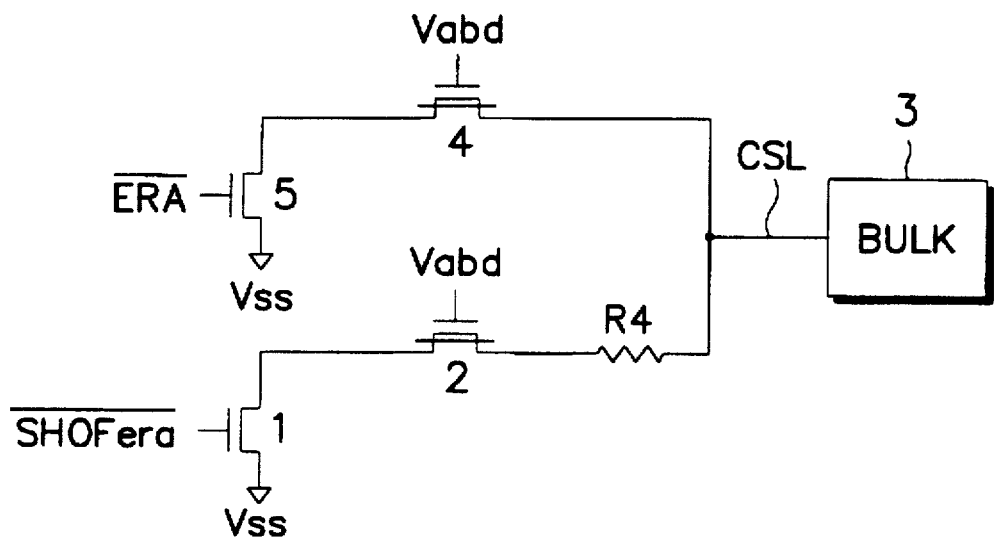
FIG. 6A is a schematic diagram of a second embodiment of a common source control circuit in accordance with the present invention.

FIG. 6A shows another embodiment of a common source line control circuit according to the present invention. The circuit of FIG. 6A is similar to the circuit of FIG. 4A, except resistor R3 is removed, and instead, a resistor R4 is connected between the drain of the depletion type NMOS transistor 2 and the bulk 3. The common source line control circuit of FIG. 6A has a first current path including the depletion type NMOS transistor 4 and the NMOS transistor 5 and a second current path including the resistor R4, the depletion type NMOS transistor 2 and the NMOS transistor 1. Thus, transistors 1 and 2 and resistor R4 are connected in series between the bulk 3 and the ground node VSS. The first path is used during the read mode, program mode and erase verification mode, whereas the second path is used during the erase voltage recovery mode. The structure and operation of the first path is substantially the same as the first path of the circuit shown in FIGS. 4A and 4B. When the signal /SHOFera goes to the logic "high" level during the erase voltage recovery operation, a large voltage drop develops across resistor R4 which reduces the voltage Vds across the depletion type NMOS transistor 2, thereby preventing snap back breakdown of the depletion type NMOS transistor 2.

Figure 6B:
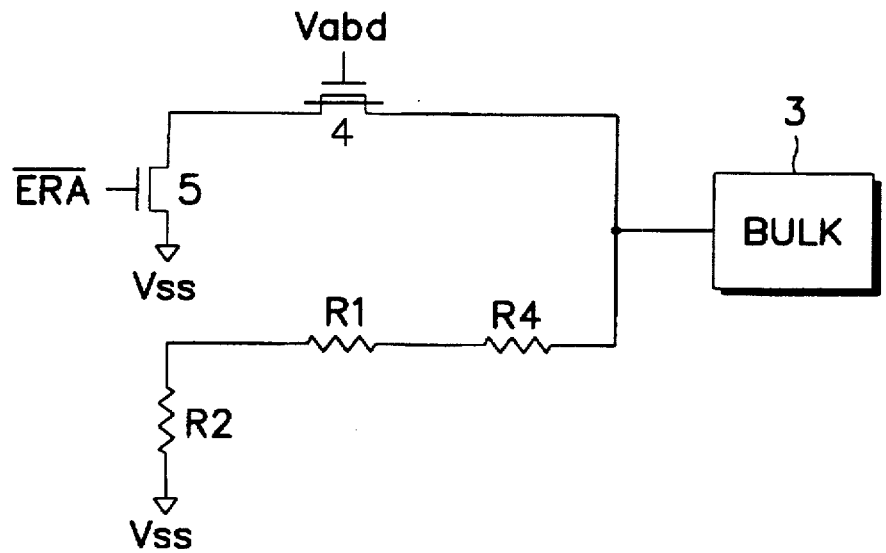
FIG. 6B is a schematic diagram of an equivalent circuit of the circuit of FIG. 6A.

FIG. 6B is an equivalent circuit diagram of the circuit of FIG. 6A during the erase voltage recovery period. Referring to FIG. 6B, a resistor R1 is an equivalent circuit of the depletion type NMOS transistor 2 and a resistor R2 is an equivalent circuit of the NMOS transistor 1. Snap back breakdown can be prevented by making the resistance value of the resistor R4 greater than those of the resistors R1 and R2.

Figure 7A:
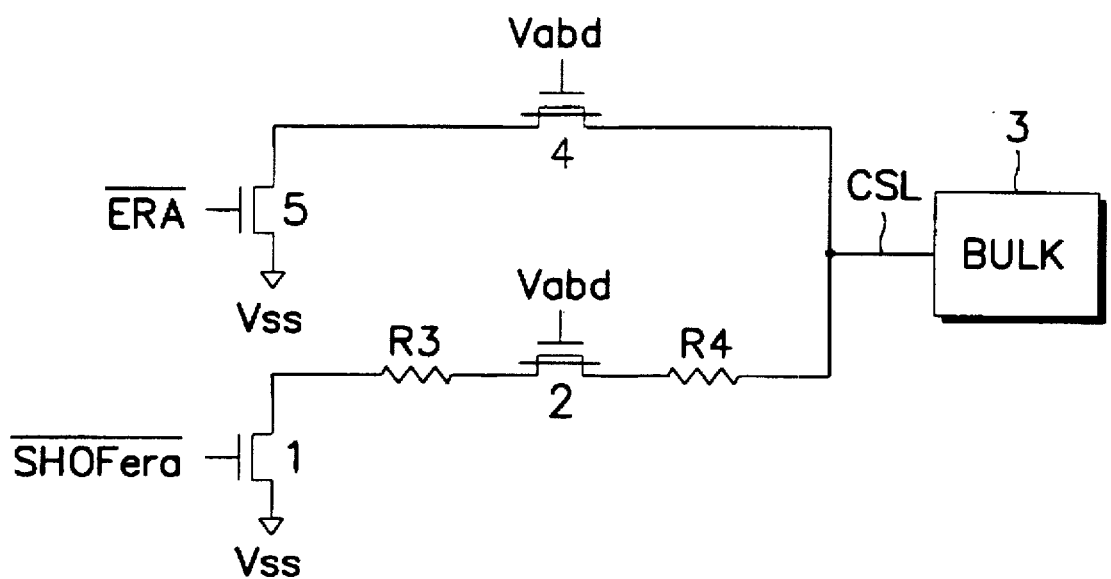
FIG. 7A is a schematic diagram of a third embodiment of a common source control circuit in accordance with the present invention.

FIG. 7A shows a third embodiment of a common source line control circuit according to the present invention. The circuit of FIG. 7A is similar to the circuit of FIG. 4A, except a resistor R4 is added between the drain of the depletion type NMOS transistor 2 and the discharging path of the bulk 3. The common source line control circuit of FIG. 7A has two parallel current paths between the bulk 3 and the power supply ground node VSS. The first current path includes the depletion type NMOS transistor 4 connected in series with the NMOS transistor 5, and the second current path includes the resistor R4, the depletion type NMOS transistor 2, the resistor R3 and the NMOS transistor 1. In the second path, the resistor R4, the depletion type NMOS transistor 2, the resistor R3 and the NMOS transistor 1 are connected in series between the bulk and the ground node VSS. The first path is used during the read, program and erase verification modes, whereas the second path is used during the erase recovery mode. When the signal /SHOFera goes to the logic "high" level during the erase recovery operation, large voltage drops develop across resistors R3 and R4 which reduces the voltage Vds across the depletion type NMOS transistor 2, thereby preventing snap back breakdown of the depletion type NMOS transistor 2.

Figure 7B:
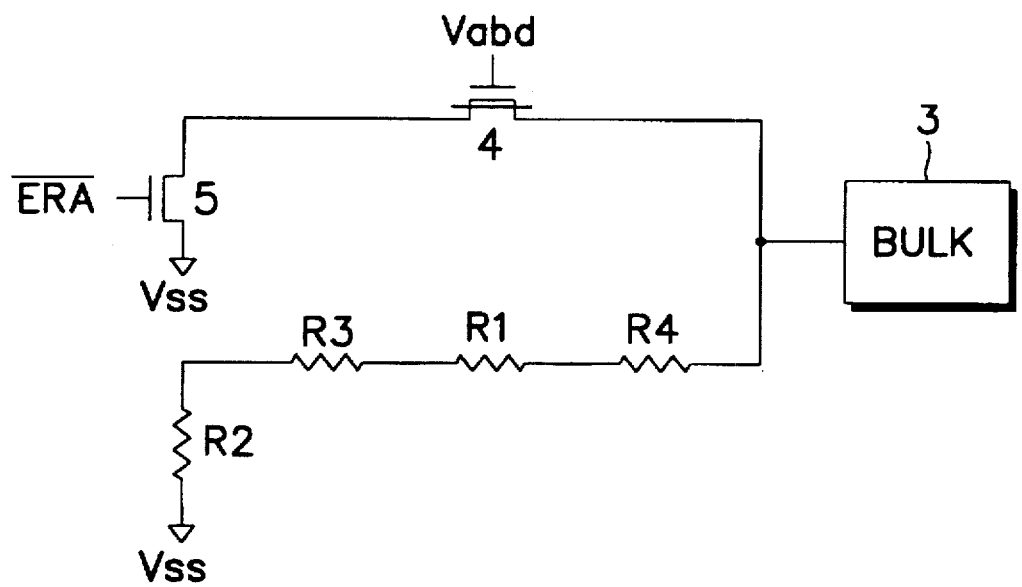
FIG. 7B is a schematic diagram of an equivalent circuit of the circuit of FIG. 7A.

FIG. 7B is an equivalent circuit diagram of the circuit of FIG. 7A during the erase voltage recovery period. Referring to FIG. 7B, a resistor R1 is an equivalent circuit of the depletion type NMOS transistor 2 and a resistor R2 is an equivalent circuit of the NMOS transistor 1. Snap back breakdown can be prevented by making the resistance values of the resistors R3 and R4 greater than those of the resistors R1 and R2.

A method for preventing snap back breakdown of the depletion type NMOS transistor 2 during the erase voltage recovery period will be discussed with reference to FIGS. 4B to 7B. Referring to FIG. 4, assuming that the voltage Vera is 20 volts, the signal Vabd is 6 volts, the threshold voltage Vt of the depletion type NMOS transistor 2 is $-2$ volts, Vera=$20e^{-(t/C(R1+R2+R3))}$, and Vds=Vera(R1/(R1+R2+R3)). Thus, Vds=$20e^{-(t/C(R1+R2+R3))} \times$(R1/(R1+R2+R3)). Therefore, snap back breakdown can be prevented by constructing the resistor R3, the depletion type NMOS transistor 2 and the NMOS transistor 1 such that the voltage Vds of the depletion type NMOS transistor 2 is below 13 volts and the pass current of the depletion type NMOS transistor 2 is below several mA.

In the circuit of FIG. 6B, Vera=$20e^{-(t/C(R1+R2+R4))}$, and Vds=Vera(R1+R2+R4)). Thus, Vds=$20e^{-(t/C(R1+R2+R4))} \times$(R1/(R1+R2+R4)). Therefore, snap back breakdown can be prevented by constructing the resistor R4, the depletion type NMOS transistor 2 and the NMOS transistor 1 such that the voltage Vds of the depletion type NMOS transistor 2 is below 13 volts and the pass current of the depletion type NMOS transistor 2 is below several mA.

In FIG. 7B, Vera=$20e^{-(t/C(R1+R2+R3+R4))}$, and Vds=Vera (R1/(R1+R2+R3+R4)). Thus, Vds=$20e^{-(t/C(R1+R2+R3+R4))} \times$(R1/(R1+R2+R3+R4)). Therefore, snap back breakdown can be prevented by constructing the resistors R3 and R4, the depletion type NMOS transistor 2 and the NMOS transistor 1 such that the voltage Vds of the depletion type NMOS transistor 2 is below 13 volts and the pass current of the depletion type NMOS transistor 2 is below several mA.

In addition, by making the transition time of the signal /SHOFera at the beginning of the erase voltage recovery period over several hundreds micro seconds, the initial resistance value of the NMOS transistor 1 can be made large, thus reducing the voltage Vds across the depletion type NMOS transistor 2.

Further, in order to allow the resistance value of the depletion type NMOS transistor 2 to be small, the signal Vabd having a high voltage level (for example, over 6 volts) should be applied to the gate of the depletion type NMOS transistor 2, thereby preventing snap back breakdown.

Having described and illustrated the principles of the invention in a preferred embodiment thereof, it should be apparent that the invention can be modified in arrangement and detail without departing from such principles. I claim all modifications and variations coming within the spirit and scope of the following claims.

We claim:

1. A circuit for controlling a common source line in a semiconductor memory device, the circuit comprising:
   a first transistor coupled between the common source line and a ground node;
   a second transistor coupled between the first transistor and the ground node; and
   a resistor coupled in series with the first transistor to reduce the voltage across the first transistor, thereby preventing snap back breakdown.

2. A circuit according to claim 1 wherein: the resistor has a first resistance;
   the first transistor has a second resistance;
   the second transistor has a third resistance; and
   the first resistance is greater than second resistance and the third resistance.

3. A circuit according to claim 1 wherein the resistor is coupled between the first transistor and the second transistor.

4. A circuit according to claim 1 wherein the resistor is coupled between the second transistor and the common source line.

5. A circuit according to claim 1 wherein the resistor is a first resistor, and further including a second resistor coupled in series with the first and second transistors between the common source line and the ground node to reduce a voltage across the first transistor, thereby preventing snap back breakdown.

6. A circuit according to claim 5 wherein:
   the first resistor has a first resistance;
   the second resistor has a second resistance
   the first transistor has a third resistance;
   the second transistor has a fourth resistance; and
   the first and second resistances are greater than the third and fourth resistances.

7. A circuit according to claim 5 wherein the first resistor is coupled between the first transistor and the second transistor, and the second resistor is coupled between the first transistor and the common source line.

8. A circuit according to claim 1 wherein the common source line is coupled to a bulk region to discharge the bulk region during an erase recovery period, and the resistor, the first transistor, and the second transistor are constructed so as to limit a voltage across the first transistor during the erase recovery period.

9. A circuit according to claim 8 wherein the resistor, the first transistor, and the second transistor are constructed so as to limit a current through the first transistor during the erase recovery period.

10. A circuit according to claim 1 further including:
    a third transistor coupled between the common source line and the ground node; and
    a fourth transistor coupled between the third transistor and the ground node.

11. A circuit according to claim 10 wherein the memory device includes a memory cell coupled to the common source line, and wherein a channel resistor of the third transistor and a channel resistor of the fourth transistor are small so as to prevent a reduction in a sense margin of the memory cell due to an increase in a voltage of the common source line during a read mode.

12. A nonvolatile semiconductor memory device comprising:
    a common source line;
    a first transistor;
    a second transistor; and a resistor;

wherein the first transistor and the second transistor are coupled in series between the common source line and a power supply node, and the resistor is coupled in series with the first transistor to reduce a voltage across the first transistor.

13. A memory device according to claim 12 wherein the resistor is a first resistor, and further including a second resistor coupled in series with the first transistor.

14. A method for controlling a common source line in a semiconductor device memory comprising:

coupling a first transistor to the common source line;

coupling a second transistor in series between the first transistor and a ground node;

coupling a resistor in series with the first and second transistors; and applying a voltage signal to a gate of the second transistor to turn the second transistor on during an erase recovery period;

wherein a voltage across the first transistor is reduced, thereby preventing snap back breakdown.

15. A method according to claim 14 wherein applying a voltage signal includes gradually increasing a voltage at a gate of the second transistor, thereby reducing a voltage across the first transistor.

16. A method according to claim 14 further including applying a second voltage signal to a gate of the first transistor during an erase period before the erase recovery period, the second voltage signal having a voltage high enough to raise a junction breakdown voltage level of the first transistor.

17. A method according to claim 14 wherein coupling the resistor in series with the first and second transistors includes coupling the resistor between the first transistor and the common source line.

18. A method according to claim 14 wherein coupling the resistor in series with the first and second transistors includes coupling the resistor between the first transistor and the second transistor.

19. A method according to claim 14 wherein the resistor is a first resistor, and further including coupling a second resistor in series with the first and second transistors between the common source line and the ground node.

20. A method according to claim 19 wherein coupling the first resistor in series with the first and second transistors includes coupling the first resistor between the first transistor and the common source line, and coupling the second resistor in series with the first and second transistors includes coupling the second resistor between the first transistor and the second transistor.

* * * * *

UNITED STATES PATENT AND TRADEMARK OFFICE
CERTIFICATE OF CORRECTION

PATENT NO. : 5,748,531
DATED : May 5, 1998
INVENTOR(S) : Choi

It is certified that error appears in the above-identified patent and that said Letters Patent is hereby corrected as shown below:

Column 2,
Line 7, "(R1+R2)" should read -- [(R1+R2) --.
Line 7, "10-9" should read -- $10^{-9}$ --.
Line 9, "to rapid the discharge" should read -- to the rapid discharge --.

Column 7,
Line 34, "Vds=Vera(R1+R2+R4)" should read -- Vds=Vera(R1/(R1+R2+R4)) --.

Column 8,
Line 31, "resistance" should read -- resistance; --.

Signed and Sealed this

Twenty-second Day of October, 2002

Attest:

Attesting Officer

JAMES E. ROGAN
*Director of the United States Patent and Trademark Office*